(12) United States Patent
Wei et al.

(10) Patent No.: US 8,591,756 B2
(45) Date of Patent: Nov. 26, 2013

(54) METHOD OF MANUFACTURING A METALLIZED CERAMIC SUBSTRATE

(75) Inventors: Shih-Long Wei, Hsinchu County (TW); Shen-Li Hsiao, Hsinchu County (TW); Chien-Hung Ho, Hsinchu County (TW)

(73) Assignee: Viking Tech Corporation, Hsinchu County (TW)

( * ) Notice: Subject to any disclaimer, the term of this patent is extended or adjusted under 35 U.S.C. 154(b) by 47 days.

(21) Appl. No.: 13/309,890

(22) Filed: Dec. 2, 2011

(65) Prior Publication Data
US 2013/0048602 A1   Feb. 28, 2013

(30) Foreign Application Priority Data
Aug. 26, 2011  (TW) .............................. 100130627 A

(51) Int. Cl.
*C23F 1/00*   (2006.01)

(52) U.S. Cl.
USPC .................. 216/100; 216/2; 216/41; 216/83; 216/102; 438/745; 438/754; 257/666; 257/668; 257/678; 257/E23.06; 428/210; 428/457

(58) Field of Classification Search
None
See application file for complete search history.

(56) References Cited

U.S. PATENT DOCUMENTS

| 6,280,640 B1 * | 8/2001 | Hurwitz et al. ................. 216/15 |
| 6,670,216 B2 | 12/2003 | Strauch |
| 7,619,302 B2 | 11/2009 | Hauenstein |

* cited by examiner

*Primary Examiner* — Lan Vinh
*Assistant Examiner* — Jiong-Ping Lu
(74) *Attorney, Agent, or Firm* — Shoemaker and Mattare

(57) ABSTRACT

A method of manufacturing a metallized ceramic substrate includes forming a metal layer on a ceramic substrate, and forming on the metal layer a resist having a first patterned resist opening and a second patterned resist opening for the metal layer to be exposed therefrom. A first width of the first patterned resist opening is greater than the thickness of the metal layer, and a second width of the second patterned resist opening is less than the thickness of the metal layer. A wet-etching process is conducted, to form in the first patterned resist opening a patterned metal layer opening and form in the second patterned resist opening a patterned metal layer dent. Therefore, an internal stress between the metal layer and the ceramic substrate is reduced, and the yield rate and reliability of the metallized ceramic substrate is increased.

11 Claims, 5 Drawing Sheets

METHOD OF MANUFACTURING A METALLIZED CERAMIC SUBSTRATE

FIELD OF THE INVENTION

This invention relates to methods of manufacturing a metallized ceramic substrate, and, more particularly, to a method of manufacturing a metallized ceramic substrate that has a reduced internal stress.

DESCRIPTION OF RELATED ART

Along with the rapid development of electronic industry, electronic products are indispensable for modern people. In general, an electronic product includes a metallized ceramic substrate such as a ceramic plate covered with copper. The ceramic plate covered with copper is generally formed by a ceramic layer sintered with a metal layer such as a copper layer by a direct bonded copper (DBC) technique at a high temperature. After sintered, the ceramic layer and the copper layer have a strong bonding force therebetween and the ceramic plate covered with copper is thus highly reliable. However, there is a fracture mode called conchoidal fracture which is an irregular and a fracture mode along a non-lattice plane between the ceramic layer and copper layer. This conchoidal fracture arises from the mismatch of thermal expansion generated by internal stress during the thermal shock fracturing of the ceramic layer under the copper layer rather than the fracturing at the interface between the ceramic layer and copper layer.

Some references state that the occurrence of the fracture mode can be reduced if the mass is reduced on the boundary of the copper layer. For example, U.S. Pat. No. 7,619,302B2 disclosed a dimple structure designed in the copper layer. The dimple had better be round on the bottom and deep into the ceramic layer, and the dimple can provide a stress releasing for the bonding between the copper layer and the ceramic layer to reduce the fracture mode and further to raise a lifetime.

U.S. Pat. No. 6,670,216B2 disclosed a ceramic plate covered by aluminum which has a structure with gradually thin construction, notch, void or groove on the boundary, so as to reduce the mass on the boundary of the aluminum layer and further reduce internal stress at the interface. The structure will prevent the ceramic layer below the aluminum layer from fracture and thus enhance the reliability and lifetime of the product.

The method for forming dimples on the surface of the metal layer in prior art usually forms continuously aligned holes by a wet etching process to reduce the mass on the metal boundary.

Please refer to FIGS. 1A to 1C, which are cross-section diagrams illustrating a method of manufacturing a ceramic plate covered with copper according to the prior art, wherein FIGS. 1C' and 1C" are different embodiments of the top view of FIG. 1C.

As FIG. 1A illustrates, a ceramic plate covered with copper 1 is stacked by a ceramic substrate 10 and a copper layer 11, and a resist layer 12 is formed on the copper layer 11 and in the surrounding has a plurality of circular openings 120 exposing the copper layer 11.

As FIG. 1B illustrates, the copper layer 11 not covered by the resist layer 12 is wet etched to form a plurality of openings 110 of the copper layer 11.

As FIG. 1C illustrates, the resist layer 12 is removed.

Because the wet etching is an isotropic process, the etching solution will isotropically etch the copper layer in the openings of the resist layer and the ceramic substrate will then be exposed after appropriate time. The final opening of the copper layer forms well-known bowl-shaped structure. However, the opening aperture of the copper layer, lateral profile and etching depth from this kind of etching method can not be easily controlled, and the final etching structure is not exactly identical to the original design figure as a result, causing that the reduction of the stress is not so large as expected. For example, if the etching time is insufficient, and if the opening aperture of the copper layer is too small and the opening depth of the copper layer is not enough, the mass on the copper boundary can not be significantly reduced and the stress can not be effectively released, as FIG. 1C' illustrates. For another example, if the etching time is too long, over-etched phenomenon would be generated such that the boundary structure of the copper layer is like the boundary of a stamp, as FIG. 1C" illustrates. That means actually new boundary of the copper layer is formed now rather than reducing the mass on the copper boundary. The function of internal stress releasing at the interface between the ceramic substrate and the copper layer is not available.

Thus, how to provide a method of manufacturing a metallized ceramic substrate to avoid the difficulty in controlling etching time, which won't effectively release the internal stress of the metallized ceramic plate by reducing the metal mass on the boundary when forming notch, void and groove in the metal layer by wet etching in prior art becomes a urgent topic.

SUMMARY OF THE INVENTION

In view of the problems of the prior art, the present invention provides a method of manufacturing a metallized ceramic substrate, including: forming a metal layer on a ceramic substrate; forming a resist on the metal layer, wherein the resist has a first patterned resist opening and a second patterned resist opening for the metal layer to be exposed therefrom, the first patterned resist opening has a first width greater than a thickness of the metal layer, and the second patterned resist opening has a second width less than the thickness of the metal layer; conducting a wet-etching process, to form in the first patterned resist opening a patterned metal layer opening for the ceramic substrate to be exposed therefrom and to form in the second patterned resist opening a patterned metal layer dent; and removing the resist.

In an embodiment, the metal layer is made of copper or aluminum, and the first patterned resist openings are in a shape of a checkerboard, and the metal layer thus becomes a plurality of isolated metal bumps arranged in a matrix after the wet etching process is conducted.

In another embodiment, the patterned metal layer dent is located at a periphery of the metal bumps and is in the shape of a rectangular ring.

In yet another embodiment, the metal material at a top periphery of either the patterned metal layer opening or the patterned metal layer dent is removed by a brushing wheel, a mounted point, a sandblasting or electrical discharge machining In an embodiment, the top periphery of either the patterned metal layer opening or the patterned metal layer dent is in the shape of an curved surface, a inclined plane or a step, and the head of mounted points can be in the conical or cylindrical shapes.

In an embodiment, the sandblasting machining include: forming on the metal layer a metal mask that has a metal mask opening for the patterned metal layer opening, the patterned metal layer dent, and peripheries thereof to be exposed therefrom; conducting a sandblasting process; and removing the metal mask.

The present invention discloses another method of manufacturing a metallized ceramic substrate, including: forming a metal layer on a ceramic substrate; forming on the metal layer a resist that has a patterned resist opening for the metal layer to be exposed therefrom; conducting a wet-etching process, to form in the patterned resist opening a patterned metal layer opening for the ceramic substrate to be exposed therefrom; removing the resist; and removing the metal layer at a top periphery of the patterned metal layer opening.

From the context mentioned above, it can be known that notch, void or groove can be easily and reliably formed on the boundary of the metal layer of the metallized ceramic substrate due to the dexterous design of the openings in width of the resist in this application. Besides, this application can further remove part of the metal layer by brushing, grinding of mounted points, sandblasting or electrical discharge machining so that the gradually thin structure can be generated on the boundary of the metal layer. This application can effectively and efficiently reduce the mass on the boundary of the metal layer of the metallized ceramic substrate and further reduce internal stress at the interface between the metal layer and the ceramic substrate to prevent the ceramic substrate below the metal layer from fracture and to improve overall lifetime and reliability.

DETAILED DESCRIPTION OF PREFERRED EMBODIMENTS

The following explains this application by specific embodiments, whoever has ordinary knowledge in the technical field of this application can easily understand advantages and efficacy of the application from the specification.

Notice that the illustrated structure, ratio and size of appended figures in the specification are only used for the disclosed embodiments in the specification for understanding and reading of those who have ordinary knowledge of this technical field. It is not applicable for limiting implementing condition of the disclosed embodiments, so the illustration does not have actual technical meaning. Any modification of structure, change of ratio and adjustment of size should fall in the disclosed embodiments when the efficacy and purpose of the disclosed embodiments are not affected. Meanwhile, the terms that are quoted in the specification like "upper," "top," "inclined," "a" and so on only intend for convenience of description rather than limiting feasible scope of the disclosed embodiments. Change or adjustment of relative relationship under no actual alteration of content of technique should be seen as feasible scope of the disclosed embodiments.

First Embodiment

Figure 1A:
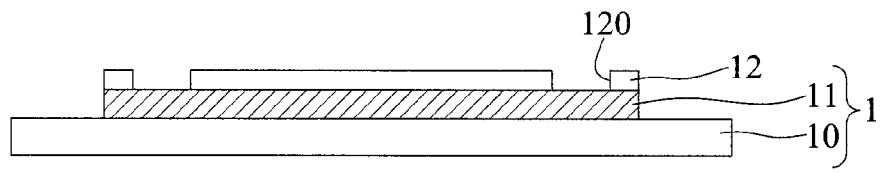
FIGS. 1A to 1C are cross-sectional diagrams illustrating a method of manufacturing a ceramic plate covered with copper according to the prior art, wherein FIG. 1C' and FIG. 1C" are different embodiments of the top view of FIG. 1C.
Figure 1B:
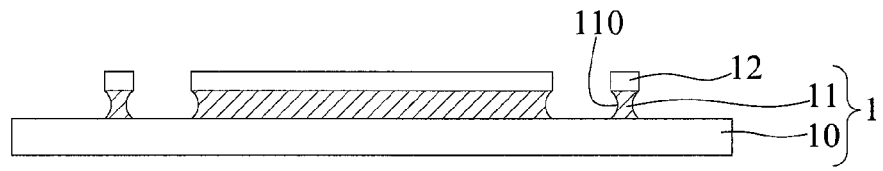
Figure 1C:
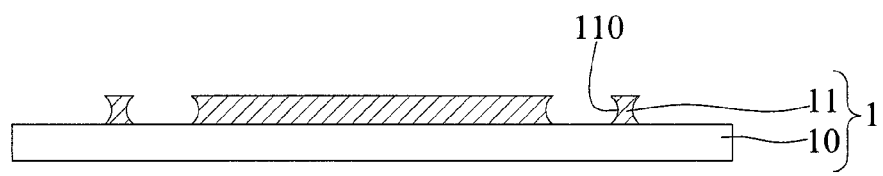
Figure 1C:
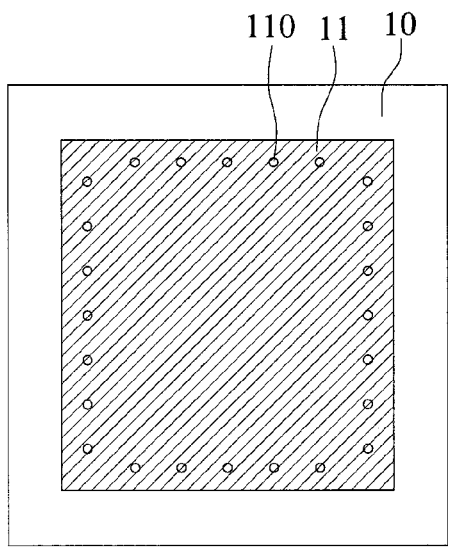
Figure 1C:
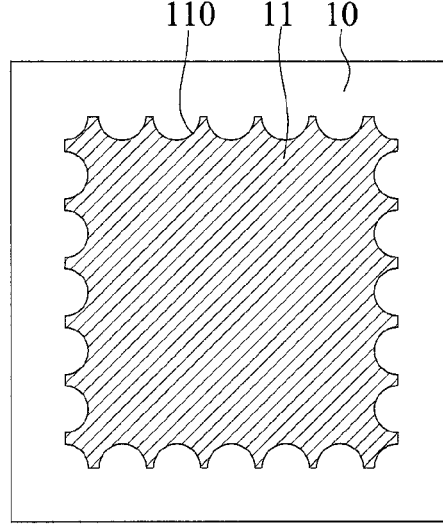
Figure 2A:
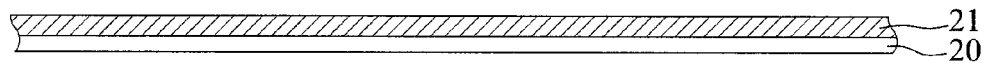
FIGS. 2A to 2D are cross-sectional diagrams illustrating a method of manufacturing a metallized ceramic substrate covered with copper of a first embodiment according to the present invention, wherein FIG. 2D' is the top view of FIG. 2D.
Figure 2B:
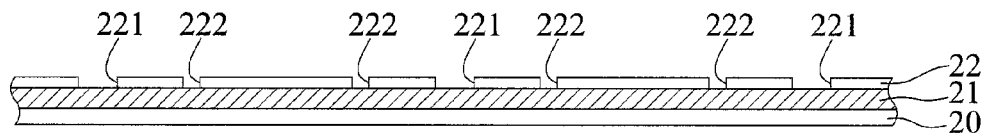
Figure 2C:
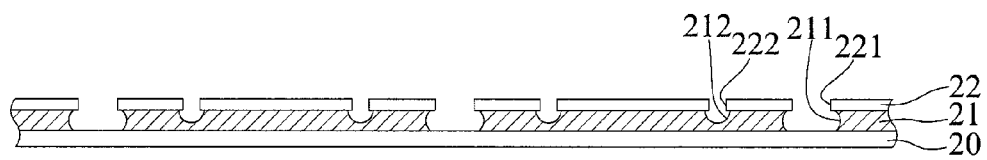
Figure 2D:
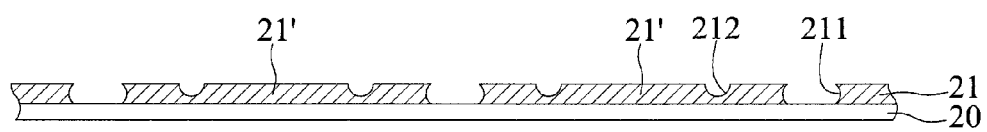
Figure 2D:
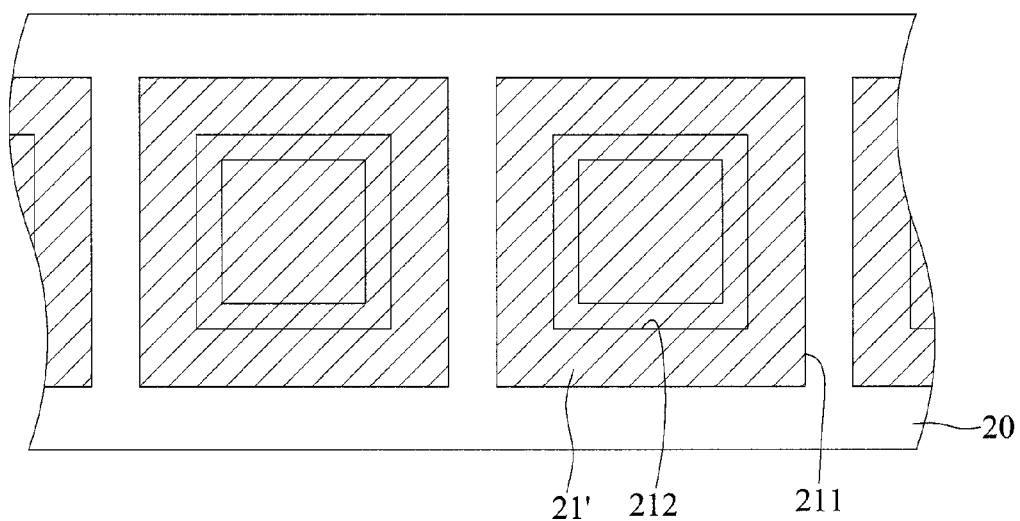

Please refer to FIGS. 2A to 2D, which are cross-sectional diagrams illustrating a method of manufacturing a metallized ceramic substrate of a first embodiment according to the present invention, wherein FIG. 2D' is the top view of FIG. 2D.

As FIG. 2A illustrates, a ceramic substrate 20 is provided, and a metal layer 21 is formed on the ceramic substrate 20, wherein the metal layer 21 may be made of copper or aluminum.

As FIG. 2B illustrates, a resist 22 is formed on the metal layer 21, and has first patterned resist openings 221 and second patterned resist openings 222 for the metal layer 21 to be exposed therefrom. The width of the first patterned resist openings 221 is greater than 1.2 times of the thickness of the metal layer 21, and the width of the second patterned resist openings 222 is less than 1.2 times of the thickness of the metal layer 21.

As FIG. 2C illustrates, a wet-etching process is conducted. Because the wet-etching process is an isotropically etching process, and the width of the first patterned resist openings 221 is greater than 1.2 times of the thickness of the metal layer 21 and the width of the second patterned resist openings 222 is less than 1.2 times of the thickness of the metal layer 21, the first patterned resist openings 221 are etched faster than the second patterned resist openings 222. Therefore, after the wet-etching process is performed for a certain period of time, patterned metal layer openings 211 for the ceramic substrate 20 to be exposed therefrom may be formed in the first patterned resist openings 221, and patterned metal layer dents 212 may also be formed in the second patterned resist openings 222.

The above "1.2 times" may be changed to "1.1 times," "1.25 times," or "1.5 times" if the metal layer 21 is made of copper, Invar/Kovar alloy or Nickel/Titanium, respectively, and may be unchanged if the metal layer 21 is made of stainless steel alloy. In brief, the width of the first patterned resist openings 221 is greater than 1.1-1.5 times of the thickness of the metal layer 21, and the width of the second patterned resist openings 222 is less than 1.1-1.5 times of the thickness of the metal layer 21, depending on the material of the metal layer 21.

As FIGS. 2D and 2D' illustrate, the resist 22 is removed.

In the first embodiment, the first patterned resist openings 221 are in the shape of a checkerboard, such that the metal layer 21 that are exposed from the first patterned resist openings 221 becomes a plurality of metal bumps 21' arranged in a matrix. Note that the first patterned resist openings 221 are not limited to the shape of the checkerboard.

In the first embodiment, the patterned metal layer dents 212 may be located at the periphery of the metal bumps 21' and arranged in the shape of a rectangular ring, as FIG. 2D' illustrates, in order to reduce the mass of the metal bumps 21' at the periphery and an internal stress between the metal layer 21 and the ceramic substrate 20. Note that the patterned metal layer dents 212 are not limited to be arranged in the shape of the rectangular ring.

Second Embodiment

Figure 3A:
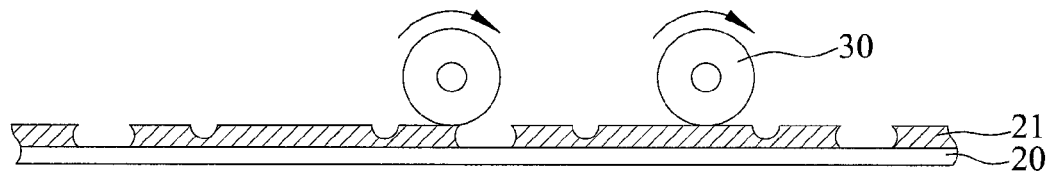
FIGS. 3A to 3B are cross-sectional diagrams illustrating a method of manufacturing a metallized ceramic substrate covered with copper of a second embodiment according to the present invention.
Figure 3B:
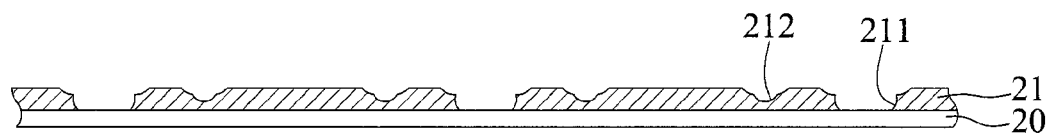

Please refer to FIGS. 3A to 3B, which are cross-sectional diagrams of a method of manufacturing a metallized ceramic substrate in a second embodiment according to the present invention.

As FIGS. 3A to 3B illustrate, subsequent to the processes performed in FIG. 2D, brushing wheels 30 brush the metal layer 21. A sand belt (not shown) may be disposed on the surface of the brushing wheels 30. A stress concentration effect may occur at a top periphery of the patterned metal layer openings 211 and the patterned metal layer dents 212 when the brushing wheels 30 are in contact with the metal layer 21. As a result, the metal layer 21 has its edge more easily brushed and removed than its surface, and the top periphery of the patterned metal layer openings 211 and the patterned metal layer dents 212 are in a curved shape, which effectively alleviating the internal stress between the metal layer 21 and the ceramic substrate 20.

In the first embodiment, the brushing wheels 30 brush the top periphery of both the patterned metal layer openings 211 and the patterned metal layer dents 212. In an embodiment of the present invention, the brushing wheels 30 may also brush the top periphery of either the patterned metal layer openings 211 or the patterned metal layer dents 212.

According to the method of the present invention, the formation of the patterned metal layer dents is optional. Accordingly, only the patterned resist openings are formed, and the metal layer at the top periphery of the patterned metal layer openings may be removed, so as to form a gradually thin structure that has a reduced internal stress between the metal layer and the ceramic substrate (that is, the patterned metal layer dents being replaced by the gradually thin structure at the top periphery of the patterned metal layer openings). The gradually thin structure may be formed by brushing wheels, mounted points, sandblasting or electrical discharge machining Third Embodiment Please refer to FIGS. 4A and 4B, which are cross-sectional diagrams of a method of manufacturing a metallized ceramic substrate of a third embodiment according to the present invention.

Figure 4A:
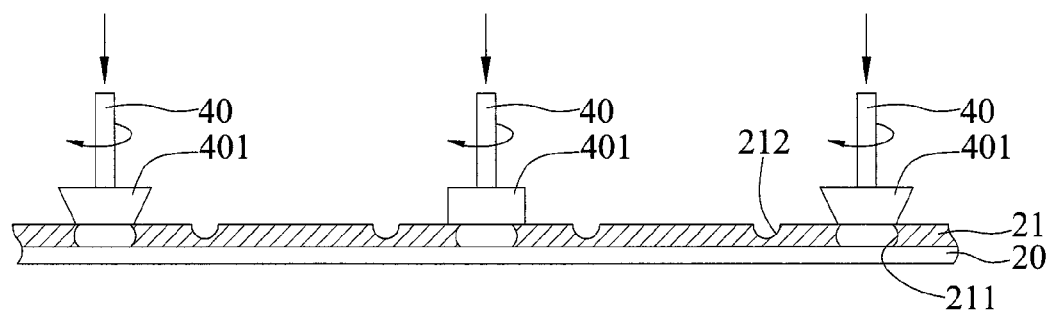
FIGS. 4A to 4B are cross-sectional diagrams illustrating a method of manufacturing a metallized ceramic substrate covered with copper of a third embodiment according to the present invention.
Figure 4B:
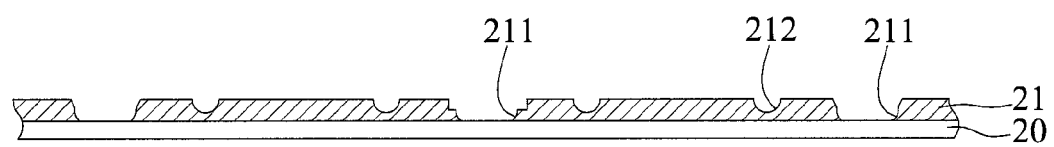

As FIGS. 4A to 4B illustrate, subsequent to the processes performed in FIG. 2D, mounted points 40 brushes and removes the metal layer 21 at the top periphery of the patterned metal layer openings 211. The head 401 of the mounted points 40 may be in the conical or cylindrical shapes such that the top periphery of the patterned metal layer openings 211 are in the shape of a inclined plane or a step, which also have reduced internal stress between the metal layer 21 and the ceramic substrate 20.

In the method according to the present invention, the formation of the patterned metal layer dents is optional. Accordingly, only the patterned metal layer openings are formed by performing the wet-etching process on the ceramic substrate, and the metal layer at the top periphery of the patterned metal layer openings is removed, in order to form a gradually thin structure that has a reduced internal stress between the metal layer and the ceramic substrate.

Fourth Embodiment

Figure 5A:
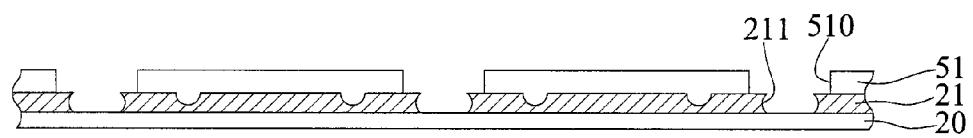
FIGS. 5A to 5C are cross-sectional diagrams illustrating a method of manufacturing a metallized ceramic substrate covered with copper of a fourth embodiment according to the present invention.
Figure 5B:
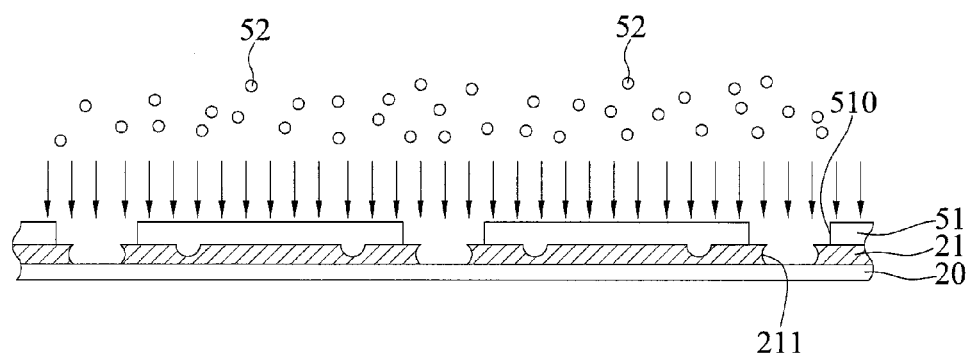
Figure 5C:
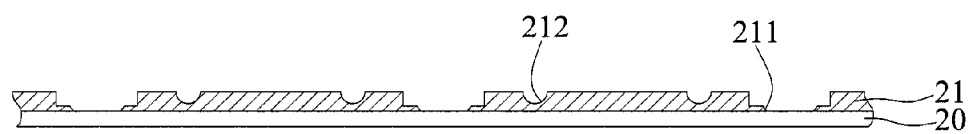

Please refer to FIGS. 5A to 5C, which are cross-sectional diagrams of a method of manufacturing a metallized ceramic substrate of a fourth embodiment according to the present invention.

As FIG. 5A illustrates, subsequent to the processes performed in FIG. 2D, a metal mask 51 is formed on the metal layer 21. The metal mask 51 has metal mask openings 510 for the patterned metal layer openings 211 and a periphery thereof to be exposed therefrom.

As FIG. 5B illustrates, a sand blasting process is performed, to remove the metal layer 21 not covered by the metal mask 51 due to the strong collision by sands 52. As a result, the patterned metal layer openings 211 have a top periphery in the shape of steps, which have reduced internal stress between the metal layer 21 and the ceramic substrate 20.

As FIG. 5C illustrates, the metal mask 51 is removed.

In an embodiment, the formation of the patterned metal layer dents is optional, only the patterned metal layer openings are formed on the ceramic substrate, and the metal layer at the top periphery of the patterned metal layer openings is removed, in order to form a gradually thin structure. In practice, a metal layer and a resist are formed on the ceramic substrate first, wherein the resist has patterned resist openings for the metal layer to be exposed therefrom. Then, a wet-etching process is performed, to form in the patterned resist openings patterned metal layer openings for the ceramic substrate to be exposed therefrom. Finally, a metal mask that has metal mask openings for the patterned metal layer openings and their periphery to be exposed therefrom, and a sand blasting process is performed on the metal mask openings, in order to form a gradually thin structure. The gradually thin structure may replace the patterned metal layer dents of the first embodiment such that an internal stress between the metal layer and ceramic substrate may be reduced.

Fifth Embodiment

Figure 6A:
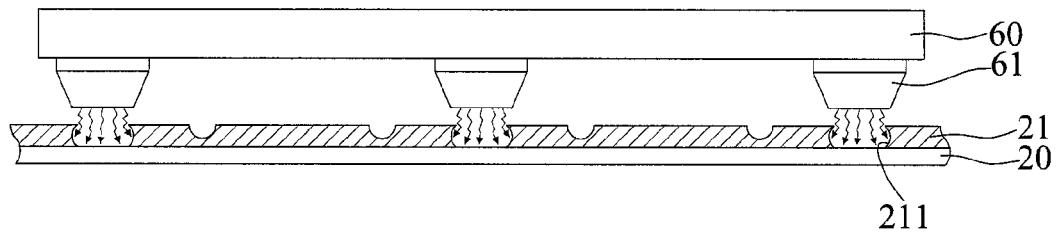
FIGS. 6A to 6B are cross-sectional diagrams illustrating a method of manufacturing a metallized ceramic substrate covered with copper of a fifth embodiment according to the present invention.
Figure 6B:
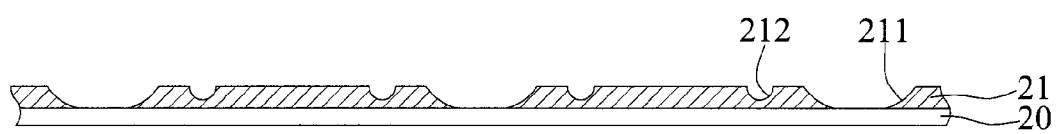

Please refer to FIGS. 6A to 6B, which are cross-sectional diagrams of a metallized ceramic substrate of a fifth embodiment according to the present invention.

As FIGS. 6A to 6B illustrate, subsequent to the processes performed in FIG. 2D, an electrical discharge machining (EDM) device (or micro-EDM device) 60 removes the metal layer 21 at the top periphery of the patterned metal layer openings 211. The electrical discharge machining device 60 has an electrode 61 is aligned with the patterned metal layer openings 211, and electrically discharging arcs may be generated on the metal layer 21 at the top periphery of the patterned metal layer openings 211 only. As a result, the metal layer 21 is melted under a high temperature. Because the material is removed under melting of high temperature after specific processing time, the purpose of reducing internal stress is achieved.

In the third, fourth and fifth embodiments, though only the metal layer at the top periphery of the patterned metal layer openings 211 is removed, it should be understood that the metal layer at the top periphery of the patterned metal layer dents 212 can also be removed.

In an embodiment of the present invention, the formation of the patterned metal layer dents is optional, and the patterned resist openings may have any width.

To sum up, because this application aims at the design of the width of the openings of the resist unlike prior art, notch, void and groove can be reliably and easily formed in the metallized ceramic substrate. Moreover, this application can further generate gradually thin structure on the boundary of the metal layer by brushing, grinding of the mounted points, sandblasting or electrical discharge machining, that is, this application can effectively and conveniently reduce the mass on the boundary of the metallized ceramic substrate, further reducing internal stress at the interface between the metal layer and the ceramic substrate, preventing the ceramic substrate below the metal layer from fracture, raising overall lifetime and reliability.

The embodiments are only illustratively explain the theory and efficacy of this application rather than limiting this application. Whoever has ordinary knowledge in the technical field of this application can modify or alter the application without violation of the spirit and scope in the application. Thus, rights protection of the application should be listed as the following claims.

The invention claimed is:

1. A method of manufacturing a metallized ceramic substrate, including:
    forming a metal layer on a ceramic substrate;
    forming a resist on the metal layer, wherein the resist has a first patterned resist opening and a second patterned resist opening for the metal layer to be exposed therefrom, the first patterned resist opening has a first width greater than a thickness of the metal layer, and the second patterned resist opening has a second width less than the thickness of the metal layer;
    conducting a wet-etching process, to form in the first patterned resist opening a patterned metal layer opening for the ceramic substrate to be exposed therefrom and to form in the second patterned resist opening a patterned metal layer dent; and
    removing the resist.

2. The method of claim 1, wherein the first patterned resist opening is in the shape of a checkerboard, and the metal layer, after the conducting of the wet-etching process, becomes a plurality of metal bumps arranged in a matrix.

3. The method of claim 2, wherein the patterned metal layer dent is located on a periphery of the metal bumps.

4. The method of claim 1, further comprising removing the metal layer at a top periphery of the patterned metal layer opening or the patterned metal layer dent.

5. The method of claim 4, wherein the metal layer at the top periphery of the patterned metal layer opening or the patterned metal layer dent is removed by a brushing wheel, a mounted point, sandblasting or electrical discharge machining.

6. The method of claim 5, wherein the sandblasting machining include:
    forming on the metal layer a metal mask that has a metal mask opening for the patterned metal layer opening, the patterned metal layer dent, and peripheries thereof to be exposed therefrom;
    conducting a sandblasting process; and
    removing the metal mask.

7. The method of claim 4, wherein the top periphery of the patterned metal layer opening or the patterned metal layer dent is in a curved surface or an inclined plane, or in a shape of steps, after removing the metal layer at the top periphery of the patterned metal layer opening or the patterned metal layer dent.

8. A method of manufacturing a metallized ceramic substrate, including:
    forming a metal layer on a ceramic substrate;
    forming on the metal layer a resist that has a patterned resist opening for the metal layer to be exposed therefrom;
    conducting a wet-etching process, to form in the patterned resist opening a patterned metal layer opening for the ceramic substrate to be exposed therefrom;
    removing the resist;
    and removing the metal layer at a top periphery of the patterned metal layer opening by.

9. The method of claim 8, wherein the patterned resist opening is in a shape of a checkerboard, and the metal layer, after the conduction of the wet-etching process, becomes a plurality of metal bumps arranged in a matrix.

10. The method of claim 8, wherein the sandblasting machining include:
    forming on the metal layer a metal mask that has a metal mask opening for the patterned metal layer opening, the patterned metal layer dent, and peripheries thereof to be exposed therefrom;
    conducting a sandblasting process; and
    removing the metal mask.

11. The method of claim 8, wherein the top periphery of the patterned metal layer opening is in a curved surface or an inclined plane, or in a shape of steps, after removing the metal layer at the top periphery of the patterned metal layer opening or the patterned metal layer dent.

* * * * *